United States Patent
Stevens et al.

(10) Patent No.: US 10,024,928 B2
(45) Date of Patent: Jul. 17, 2018

(54) INVERTER AND DETECTION METHOD FOR AN INVERTER FOR DETECTING A NETWORK FAULT

(71) Applicant: SMA Solar Technology AG, Niestetal (DE)

(72) Inventors: Stijn Stevens, Escherode (DE); Vitali Sakschewski, Gudensberg (DE)

(73) Assignee: SMA Solar Technology AG, Niestetal (DE)

( * ) Notice: Subject to any disclaimer, the term of this patent is extended or adjusted under 35 U.S.C. 154(b) by 273 days.

(21) Appl. No.: 15/138,412

(22) Filed: Apr. 26, 2016

(65) Prior Publication Data

US 2016/0252588 A1 Sep. 1, 2016

Related U.S. Application Data

(63) Continuation of application No. PCT/EP2014/073137, filed on Oct. 28, 2014.

(30) Foreign Application Priority Data

Oct. 28, 2013 (DE) .................... 10 2013 111 870

(51) Int. Cl.
 *G01R 31/40* (2014.01)
 *H02M 1/32* (2007.01)
 (Continued)

(52) U.S. Cl.
 CPC .............. *G01R 31/40* (2013.01); *H02J 3/383* (2013.01); *H02J 3/386* (2013.01); *H02J 3/387* (2013.01);
 (Continued)

(58) Field of Classification Search
 CPC ...................................... G01R 31/40
 See application file for complete search history.

(56) References Cited

U.S. PATENT DOCUMENTS 8,138,739 B1 3/2012 Eirea et al.
8,378,515 B2 2/2013 Fortmann
(Continued)

FOREIGN PATENT DOCUMENTS

DE 102011054770 A1 4/2013
EP 0576271 BI 6/1993
(Continued)

OTHER PUBLICATIONS

International Search Report dated Feb. 27, 2015 PCT/EP2014/073137.
(Continued)

*Primary Examiner* — Clayton E Laballe
*Assistant Examiner* — Jas Sanghera
(74) *Attorney, Agent, or Firm* — Eschweiler & Potashnik, LLC

(57) ABSTRACT

The disclosure relates to a detection method for an inverter for detecting a grid fault in a power supply grid, includes determining a grid impedance (Z) and/or the rate of change thereof with respect to time (dZ/dt) and/or a rate of change of an absolute value of the grid impedance (Z) with respect to time (d|Z|/dt), comparing the absolute value and/or a real part and/or an imaginary part of the grid impedance (Z) and/or the rate of change thereof with respect to time (dZ/dt) and/or the rate of change of the absolute value of the grid impedance (Z) with respect to time (d|Z|/dt) with respective predetermined limit values. The method also includes detecting a grid fault state based on the comparison, wherein a distinction is drawn between an islanding situation (AID) and a fault ride through (FRT) situation, and signaling an existing islanding situation (AID) or a fault ride through (FRT) situation as a grid fault state. The disclosure additionally relates to an inverter that is arranged to perform the method.

14 Claims, 11 Drawing Sheets

(51) Int. Cl.
*H02M 7/48* (2007.01)
*H02S 50/10* (2014.01)
*H02J 3/38* (2006.01)

(52) U.S. Cl.
CPC ............... *H02M 1/32* (2013.01); *H02M 7/48* (2013.01); *H02J 2003/388* (2013.01); *Y02E 10/563* (2013.01); *Y02E 10/763* (2013.01)

(56) References Cited

U.S. PATENT DOCUMENTS

| | | |
|---|---|---|
| 2003/0098671 A1 | 5/2003 | Hochgraf |
| 2012/0306515 A1* | 12/2012 | Barnes ................... H02J 3/383 |
| | | 324/707 |
| 2013/0077367 A1 | 3/2013 | Zhu et al. |
| 2013/0155734 A1 | 6/2013 | El-Barbari et al. |
| 2014/0152331 A1* | 6/2014 | Wagoner ................ G01R 27/16 |
| | | 324/705 |

FOREIGN PATENT DOCUMENTS

| | | |
|---|---|---|
| EP | 2501014 A1 | 3/2011 |
| WO | 2008153419 A2 | 12/2008 |

OTHER PUBLICATIONS

Mattavelli, P., A Modified Dead-Beat Control for Ups Using Disturbance Observers, DIEGM, University of Udine, Via delle Scienze 208, 33110 Udine, Italy pp. 1618-1623.

\* cited by examiner

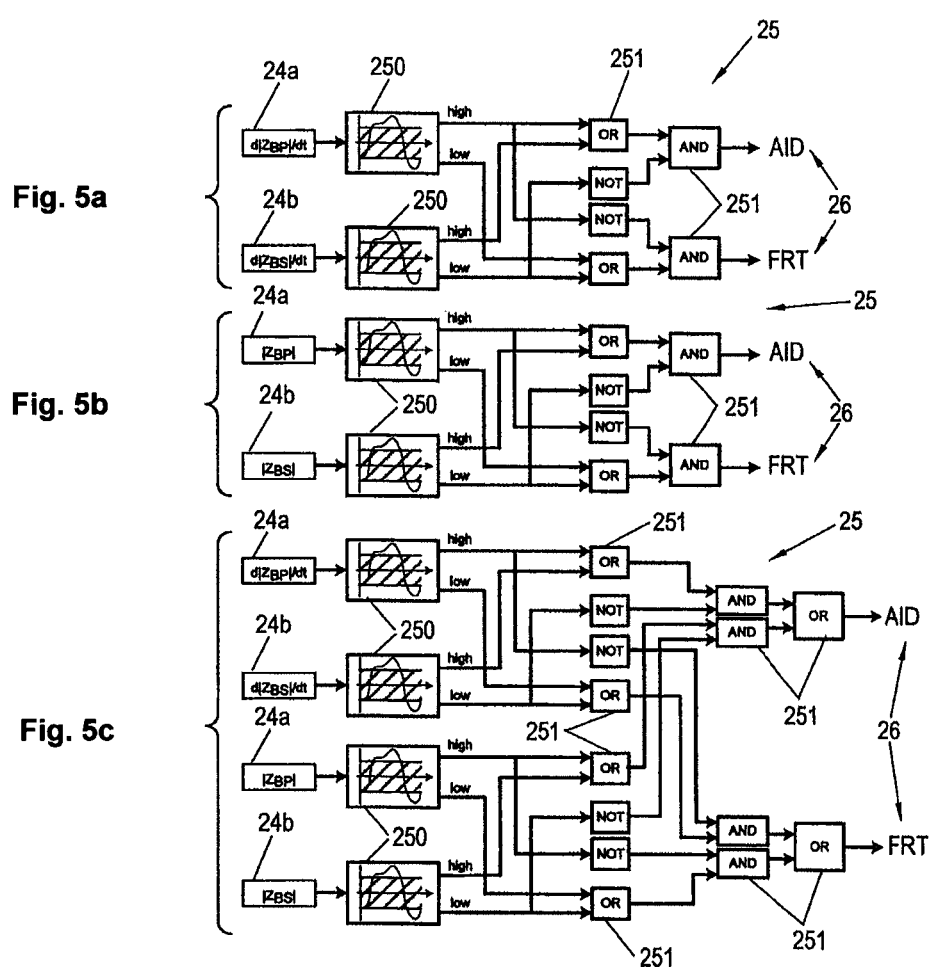

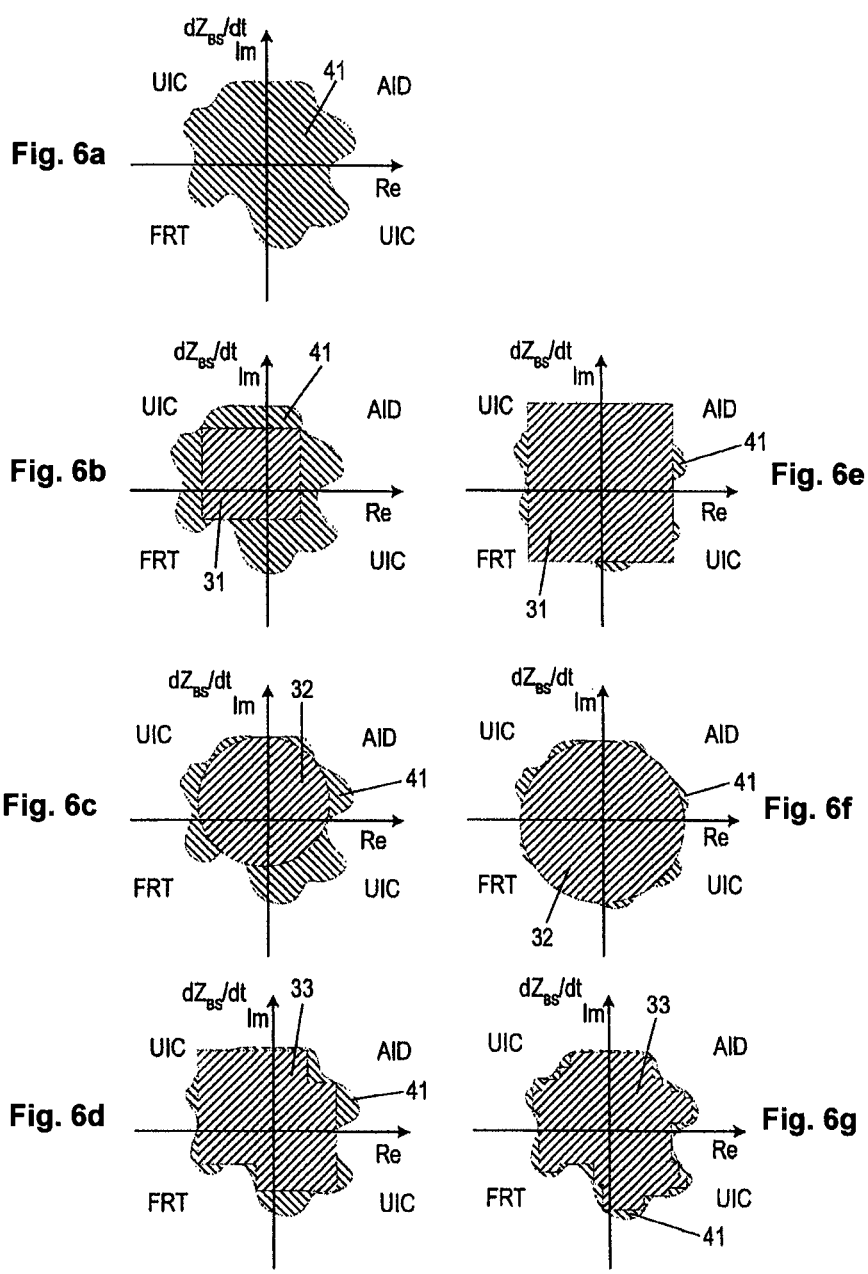

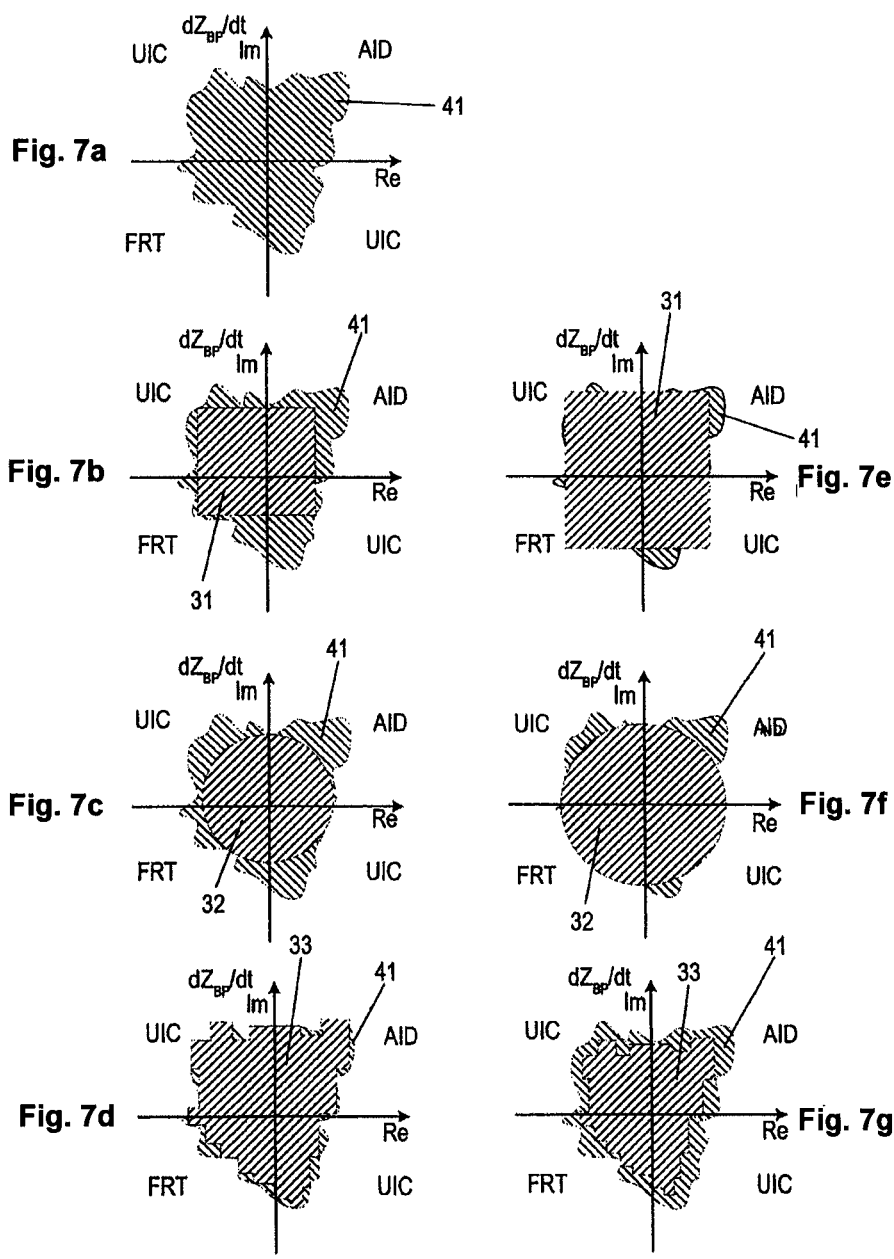

INVERTER AND DETECTION METHOD FOR AN INVERTER FOR DETECTING A NETWORK FAULT

CROSS REFERENCE TO RELATED APPLICATIONS

This application claims priority to International Patent Application number PCT/EP2014/073137, filed on Oct. 28, 2014, which claims priority to German Patent Application number 10 2013 111 870.4, filed on Oct. 28, 2013, and is hereby incorporated by reference in its entirety.

FIELD

The disclosure relates to a detection method for an inverter for detecting a grid fault in a power supply grid. The disclosure additionally relates to an inverter for supplying electric power to a power supply grid, which inverter is arranged to perform the method.

BACKGROUND

Inverters are used for converting direct current, for example produced by a photovoltaic generator (PV generator) in a photovoltaic installation (PV installation), into an alternating current that is suitable for supply to a power supply grid. In light of the increasing prevalence of regenerative power generating installations, particularly PV installations, the demands of power supply companies on the functionality of the inverter, particularly in respect of grid-supporting operation, are rising. The operators of power supply grids frequently have the demand, specified in what is known as the Grid Code, that regenerative power generating installations are not, as usual in the past, shut down in the event of a grid failure, for example in the event of voltage drops, but rather must be able to ride through the grid failure (fault ride through—FRT). This means that, on the one hand, at the end of the grid failure, power can be supplied to the power supply grid again as immediately as possible and, on the other hand, during the grid fault, the power supply grid can have its voltage supported by a supply of reactive current. By way of example, a grid fault occurs if the amplitude or the RMS value of a single-phase system grid voltage is below a minimum value. In the case of polyphase power supply grids, a similar definition can be provided on the basis of the amplitude mean values of the individual phases, for example. On account of the significantly reduced grid voltage in such a case, generation of the demanded reactive and/or active current requires only a small RMS output voltage from the inverters.

A rather short grid fault that is intended to be ridden through in order to support the grid (FRT) must be distinguished from a grid fault that results in the formation of an islanding situation for the PV installation. Such an islanding situation is characterized by complete or almost complete outage of the power supply grid. In such a situation, there is usually provision for the PV installation to be shut down, e.g. for reasons of protection against electric shock. It is alternatively also possible for the local loads connected to the inverter to be supplied with power, if the PV installation and particularly the inverters thereof are arranged for this.

A method of detecting and discriminating between a grid failure that needs to be ridden through and an islanding situation practiced up to now is based, by way of example, on the attempt to actively influence the current in the power supply grid, for example to alter the phase of the current. Depending on the reaction of the power supply grid to this disturbance attempt, it is possible to infer one or the other state of the grid.

The document US 2013/0155734 A1 discloses a method in which different measured electrical parameters of a power supply grid are used in order to determine whether there is possibly an islanding situation in the power supply grid. Suitable parameters that are mentioned are a voltage measured in the power supply grid, a current, a frequency or an impedance. If there is a potential islanding situation, a supply of active and/or reactive power to the power supply grid is increased in order then to take a fresh measurement of one or more of the mentioned parameters as a basis for checking the forecast of the first measurement.

As the prevalence of supplying PV installations in power supply grids increases, these methods, like other active methods for detecting islanding, reach their limits. The reason is that the inverters disturb each other with their methods for detecting islanding, and these methods increasingly lead to unreliable results or an unstable operating state.

SUMMARY

The disclosure provides an alternative method for detecting a grid fault state, particularly an islanding situation and/or a grid failure that needs to be ridden through, in which no disturbing repercussion on the power supply grid arises. In addition, a clear distinction needs to be drawn between an islanding situation, in which the inverter may need to be shut down, and a grid fault that the inverter needs to ride through.

A detection method according to the disclosure for an inverter for detecting a grid fault in a power supply grid comprises determining a grid impedance and/or the rate of change thereof with respect to time and/or a rate of change of an absolute value of the grid impedance with respect to time. The method further comprises comparing the absolute value and/or a real part and/or an imaginary part of the grid impedance and/or of the rate of change thereof with respect to time and/or of the rate of change of the absolute value of the grid impedance with respect to time with predetermined limit values. The result of the comparison is taken as a basis for detecting a grid fault state, wherein a distinction is drawn between an islanding situation and an FRT situation. Finally, an existing islanding situation or an FRT situation is signaled as a grid fault state.

A distinction between an islanding situation and an FRT situation is therefore made on the basis of the magnitude of the real part and/or of the imaginary part of the rate of change of the grid impedance with respect to time and/or on the basis of the magnitude of the value of the rate of change of the absolute value of the grid impedance with respect to time. The determination of the grid impedance or of the rate of change thereof allows the grid state and hence also a grid fault state to be inferred from the connection point of the inverter. In this case, the determination of the grid impedance has no repercussions on the power supply grid and allows a distinction to be made between an islanding situation and an FRT situation.

According to an advantageous embodiment of the detection method, if an upper limit value for the absolute value of the grid impedance is exceeded, the existence of an islanding situation is detected and signaled, and if a lower limit value for the absolute value of the grid impedance is underrun, an FRT situation is detected and signaled.

An islanding situation or an FRT situation can be detected on the basis of the magnitude of the real part and/or of the imaginary part of the rate of change of the grid impedance with respect to time and/or on the basis of the magnitude of the value of the rate of change of the absolute value of the grid impedance with respect to time. In a further advantageous embodiment, an islanding situation or an FRT situation is detected if an absolute value of the real part of the rate of change of the grid impedance with respect to time and/or the value of the rate of change of the absolute value of the grid impedance with respect to time is greater than a first predetermined limit value and/or an absolute value of the imaginary part of the rate of change of the grid impedance with respect to time is greater than a second predetermined limit value.

In a further embodiment, an islanding situation is detected and signaled if the real part of the rate of change of the grid impedance with respect to time and/or the value of the rate of change of the absolute value of the grid impedance with respect to time is positive and an FRT situation is detected and signaled if the real part of the rate of change of the grid impedance with respect to time and/or the value of the rate of change of the absolute value of the grid impedance with respect to time is negative.

It is therefore advantageously possible to take the determined grid impedance or the rates of change thereof as a basis for making specific statements about the grid state.

In a further advantageous embodiment of the detection method, the determination of the grid impedance and/or of the rate of change thereof with respect to time and/or of the rate of change of the absolute value of the grid impedance with respect to time is based on an evaluation of input variables that are filtered in advance by a bandpass filter and/or a band rejection filter. Preferably, this is done for a harmonic pertaining to the grid frequency of the power supply grid and particularly preferably for the third harmonic. With further preference, determination of the grid impedance is based on an evaluation of variables that are filtered in advance in a first evaluation path by a bandpass filter and in a second evaluation path by a band rejection filter. Values determined in this manner for the grid impedance are particularly meaningful for the grid state.

In a further advantageous embodiment of the detection method, the grid impedance and/or the rate of change thereof with respect to time and/or the rate of change of the absolute value of the grid impedance with respect to time is determined by at least one state observer that emulates and observes a section of an inverter coupled to the power supply grid. In principle, the grid impedance and/or the rate of change thereof with respect to time and/or the rate of change of the absolute value of the grid impedance with respect to time can also be determined in another manner in order to perform the method according to the disclosure. However, a state observer allows the mentioned variables to be determined quickly (in real time) and, if a suitable emulation model is selected, also accurately and particularly effectively. There is then no possibility of any repercussion on the power supply grid.

An inverter according to the disclosure for supplying electric power to a power supply grid features a detection apparatus comprising a discriminator unit, wherein the discriminator unit is arranged to compare an absolute value and/or a real part and/or an imaginary part of an afore determined grid impedance and/or of the rate of change thereof with respect to time and/or a value of the rate of change of the absolute value of the grid impedance with respect to time with predetermined limit values and detect a grid fault state on the basis of the result of the comparison, wherein a distinction is drawn between an islanding situation and an FRT situation. The discriminator unit is additionally arranged to signal a detected islanding situation or FRT situation as a grid fault state. The advantages described in connection with the detection method result.

In one advantageous embodiment, the operating state of the inverter is dependent on the signaled grid fault state. The inverter can thus react to detected grid states and, by way of example, ride through a grid fault or, if necessary, shut itself down.

In a further advantageous embodiment, the detection apparatus comprises at least one state observer for determining the grid impedance and/or the rate of change thereof with respect to time and/or the rate of change of the absolute value of the grid impedance with respect to time, which state observer emulates and observes a section of the inverter. It is thus possible to use the reaction of the section, for example a controlled section of the inverter, indirectly to determine the grid impedance.

BRIEF DESCRIPTION OF THE DRAWINGS

The disclosure is explained in more detail below using embodiments with reference to figures, in which:

FIGS. 5a-5c each show a schematic illustration of an embodiment of a discriminator unit for deriving the operating states of the power supply grid;

FIGS. 6a-6g and 7a-7g show further graphs to illustrate the derivation of operating states of the power supply grid from the determined parameters of the power supply grid;

DETAILED DESCRIPTION

Figure 1:
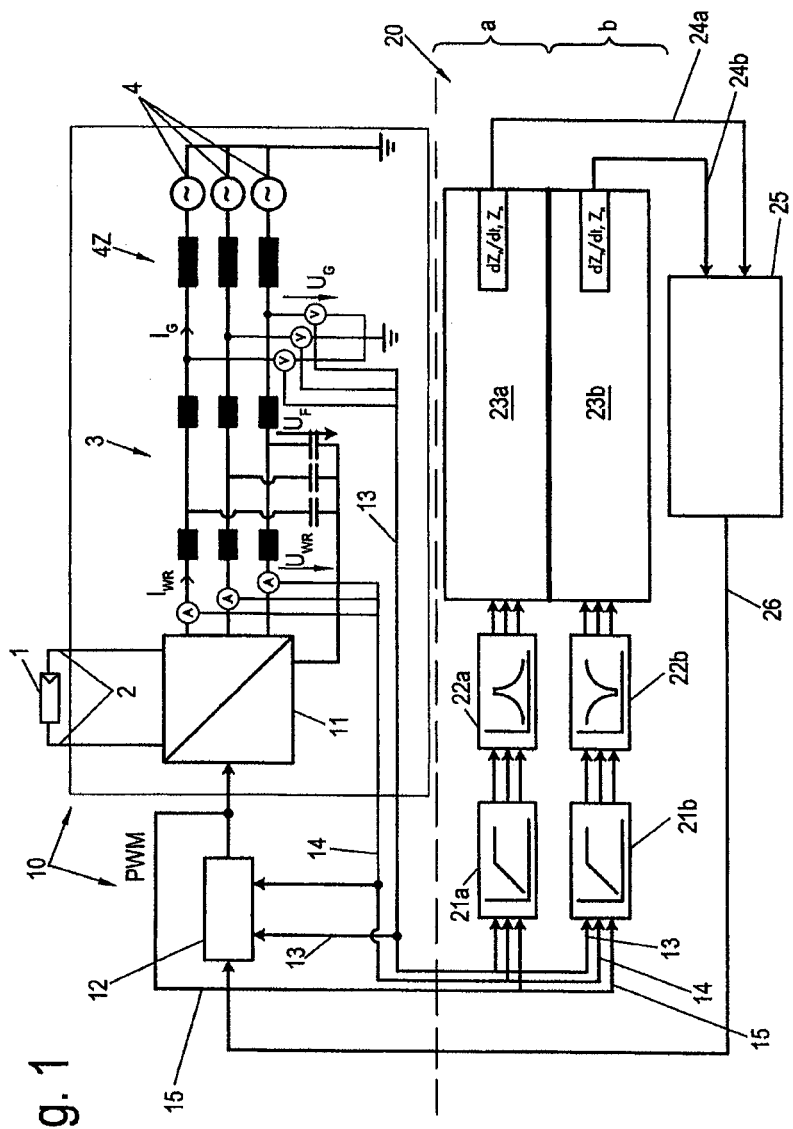
FIG. 1 shows a schematic overview illustration of a PV installation with an inverter that is suitable for implementing a method according to the disclosure.

FIG. 1 uses a block diagram to show an overview diagram of a power generating installation for supplying to a power supply grid. In the example shown, the power generating installation is a PV installation. The method according to the disclosure and the inverter according to the disclosure can, however, also be used in a different power generating installation, for example a wind energy installation or an installation comprising battery stores or fuel cells.

The PV installation comprises a PV generator 1, which is symbolized here by the graphical symbol for a single PV cell by way of example. It goes without saying that, in an implementation of the PV installation shown, the PV generator 1 may be formed by an interconnection of a multiplicity of PV modules, which are in turn constructed from single PV cells. In this case, the interconnection of the PV modules can comprise particularly a series interconnection, what is known as a PV string.

The PV generator 1 is connected to a power section 11 of an inverter 10 via DC lines 2. The power section 11 has AC outputs, which are connected to a power supply grid 4 via a filter network 3 at a grid connection point. The filter network 3 is used for signal shaping for the alternating current at the AC outputs of the power section 11 and is therefore subsequently also referred to as a sine wave filter 3. In this case, the power supply grid 4 is embodied in three-phase form by way of example, but it goes without saying that a different number of phases, for example a single-phase embodiment both for the inverter 10 and for the power supply grid 4, is also possible. In the lines to the power supply grid 4 there are impedances 4Z drawn in, which symbolize the respective impedances of the respective phase of the power supply grid 4 by which the individual phases present themselves to the inverter 10. In this case, the impedance characterizes the state of the power supply grid 4 to a significant degree.

It is noted that FIG. 1 shows only elements of the PV installation that are essential for the purposes of the disclosure. It is thus possible for there to be provision, on the DC and/or AC side of the inverter 10, for, by way of example, switching elements (for example isolating elements, contactors), filters, grid monitoring devices and/or transformers, which are not shown. The power section 11 may likewise contain further components that are not shown, for example one or more converter stages, intermediate circuits or even possibly further transformers.

Besides the power section 11, the inverter 10 has a control unit 12. The control unit 12 is supplied with voltage signals 13 and current signals 14 as input variables. The voltage signals 13 and the current signals 14 are obtained at appropriate measuring points or using appropriate measurement sensors and/or measurement signal converters. The voltage signal 13 represents a grid voltage $U_G$ of the power supply grid 4. The current signal 14 represents a current $I_{WR}$ flowing at the AC output of the power section, said current being called inverter current $I_{WR}$ in the following. Further subsequently relevant variables are the voltage at the output of the power section 11 of the inverter 10, referred to as inverter voltage $U_{WR}$ in the following, the voltage within the sine wave filter, called filter voltage $U_F$ in the following, and the current flowing into the power supply grid 4, called grid current $I_G$ in the following. It goes without saying that these variables may be vectorial variables having multiple components in accordance with the number of phases of the inverter 10.

On the basis of the measured voltage and current signals 13, 14, the control device 12 generates driving signals for the power section 11 of the inverter 10. These driving signals are used to drive power switching elements in the power section 11. Usually, these are driven by means of pulse width modulation, which is why the driving signals are referred to as pulse width modulation (PWM) signals 15 in the following.

The PV installation further comprises a detection apparatus 20 that is used for detecting grid faults. The detection apparatus 20 may be integrated in the inverter 10 or be designed as a separate unit and connected to the inverter.

The detection apparatus 20 receives as input signal both the voltage signals 13 and the current signals 14, which are also input signals for the control device 12, and the PWM signals 15, which are output signals from the control device 12. These input signals for the detection apparatus 20 are processed in parallel in two paths, which are distinguished from each other in the following by the suffix a or b in the reference numerals. First of all, the input signals in each of the paths a, b are input to an amplifier 21a, 21b, where they are amplified to suitable voltage values. Filters 22a, 22b are connected downstream of the amplifiers 21a, 21b, wherein a bandpass filter is used as filter 22a in path a and a band rejection filter is used as filter 22b in path b.

The signals conditioned in this manner are each input to a state observer 23a, 23b. The operation and embodiment of the state observer will be explained in more detail below in connection with FIG. 2. Output variables 24 from the two state observers 23a, 23b are supplied to a discriminator unit 25. In the present case, the output variables 24 that are output by the two state observers 23a, 23b are in particular a grid impedance Z and the rate of change thereof with respect to time dZ/dt. The determination thereof will be explained in more detail later in connection with FIG. 2. Although not explicitly shown in FIG. 1, the output variables 24 that are output may also be an absolute value |Z| of the grid impedance Z and a rate of change of the absolute value |Z| of the grid impedance Z with respect to time d|Z|/dt.

The discriminator unit 25 takes the output variables 24 as a basis for determining output signals 26 that indicate whether there is a grid fault and whether this grid fault is one that should be ridden through (FRT) or one that characterizes an islanding situation. The output signals 26 are input as control signals to the control device 12 of the inverter 10 so that the inverter can react to the detected grid fault in a suitable manner. By way of example, provision may be made for the inverter to be shut down in the event of an islanding situation (AID) being detected. If designed for the purpose, provision may also be made for the inverter 10 to switch to an island supply mode, in which it supplies power to local loads connected thereto. If the discriminator unit 25 uses the output signals 26 to signal a grid fault that needs to be ridden through (FRT), the inverter 10 is accordingly driven such that it can support the power supply grid 4, for example by supplying reactive current and/or reactive power.

Figure 2:
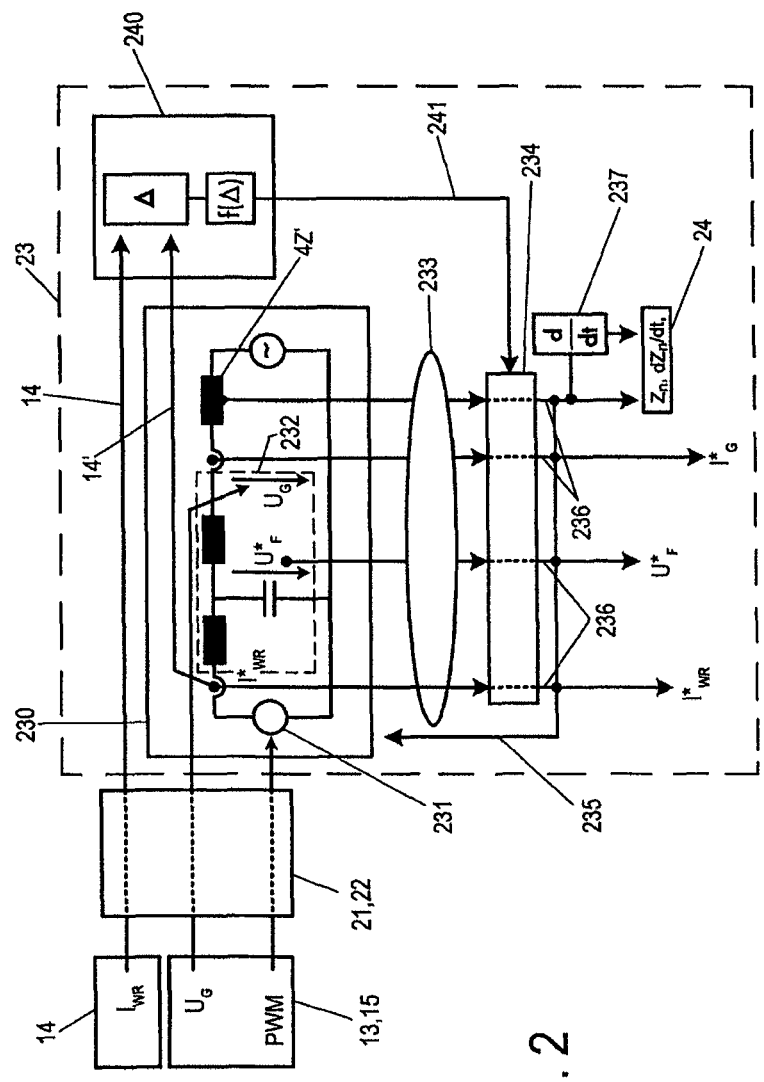
FIG. 2 shows a schematic illustration of a state observer for determining parameters of a power supply grid in a first embodiment.

FIG. 2 shows the operation of the state observers 23a, 23b in a schematic diagram. Components in paths a and b in FIG. 1 are used without the suffix a or b below, since the explanation for FIG. 2 relates both to path a and to path b.

First of all, the left-hand part of FIG. 2 again depicts the input variables for the detection apparatus 20, specifically the current signals 14, the voltage signals 13 and the PWM signals 15, and also the conditioning of these signals in the amplifier 21 and the filter 22. The right-hand part of the figure shows the state observer 23 in more detail.

The state observer 23 comprises a model 230 that reproduces the observed real system, to be more precise the observed section. For the sake of simpler representation, the model in the figure is shown only for one of the system phases. It goes without saying that in the case of a polyphase real system the model is also embodied in polyphase form. Preferably, the model is implemented by programming in an appropriate computation unit (controller). In the present case, the model comprises a voltage source 231, downstream of which a sine wave filter 232, constructed from inductances and a capacitance, is connected. The voltage source 231 emulates the operation of the semiconductor output bridge of the power section 11 of the inverter 10. Its output is routed to the sine wave filter 232, which is likewise present, in the same form, in the power section 11 of the inverter 10 and is used for signal shaping to produce a sinusoidal output current. The voltages and currents corresponding to the real system (inverter voltage $U_{WR}$, filter voltage $U_F$, grid voltage $U_G$, inverter current $I_{WR}$, grid current $I_G$) are likewise shown in the model and denoted by an added asterisk (*). For the grid voltage, $U^*_G = U_G$ holds in this case, since this variable is given as a measured variable and is not tracked in the model.

It is noted that the model shown here is one of possibly multiple ways of reproducing the real section as well as possible. It goes without saying that the real section can also be reproduced by other, if necessary, more complex models. In one preferred embodiment, the state observer 23 is embodied as a Kalman filter.

In the model, as in the real section, the voltage source 231 (the power section of the inverter 10) is driven by the PWM signal 15. At the output of the sine wave filter 232 accordingly the voltage signal 13 is present, which is predetermined for the model due to the input signals.

Further, the model comprises a modeled grid impedance 4Z' to which the unit consisting of the voltage source 231 and the sine wave filter 232 downstream of it feeds in, just like the power section 11 feeds in to the power supply grid 4 with the impedance 4Z. The model also comprises a virtual current measuring sensor that indicates the output current from the voltage source 231. This output current is called modeled current signal 14', since it corresponds to the current signal 14 from the real measuring section. All variables in the model 230 that are able to be measured or altered in this way are referred to in summary as state variables 233 of the model 230.

The modeled current signal 14' is input to a comparator 240 after being derived from the model 230. The comparator 240 is likewise supplied with the current signal 14. The two have their magnitudes compared with each other and are processed further by a predetermined error function $f(\Delta)$. The processed error signal between the measured current signal 14 and the modeled current signal 14' is a measure of the quality factor 241 of the model 230. The computed quality factor 241 is input to a correction unit 234 that takes predetermined function correlations as a basis for performing correction on the adjustable state variables 233 of the model 230 such that an adjustment to the model 230 is iteratively attained, which leads to an improved or increased quality factor 241. Expressed the other way round, the error function $f(\Delta)$ is minimized.

The repercussion on the state variables of the model is symbolized by a model correction 235 that is shown as an arrow. Those of the state variables 233 that are used for comparison are also referred to as tracked state variables.

When a predetermined quality factor 241 has been reached or the quality factor 241 is not increased further, it is assumed that the model 230 describes the real section sufficiently well. The state variables 233 of the model 230 are then output as derived variables 236. In particular, the derived variables 236 include the magnitude of the modeled grid impedance 4Z', which represents the real grid impedance 4Z, and which is referred to as $Z_n$ below. From the derived variables 236, it is in turn possible to determine indirectly derived variables 237, in the present case particularly the rate of change of the grid impedance Z with respect to time (derivative), which is referred to as dZ/dt below. Although not explicitly shown in FIG. 2, the absolute value |Z| of the grid impedance Z and the rate of change of the absolute value |Z| of the grid impedance Z with respect to time d|Z|/dt may also be available here as output variables 24.

The state observer 23 that has been presented can thus be used to emulate grid variables such as the grid impedance Z and the rate of change thereof with respect to time dZ/dt on the basis of the behavior of the real section without the power supply grid 4 being actively disturbed.

Figure 3A:
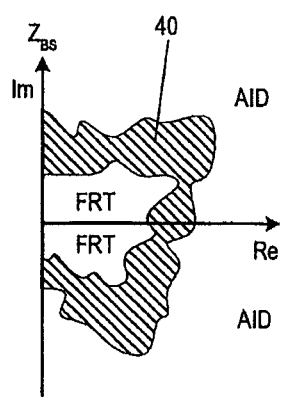
FIGS. 3a-3d show graphs to illustrate the derivation of operating states of the power supply grid from the determined parameters of the power supply grid.
Figure 3B:
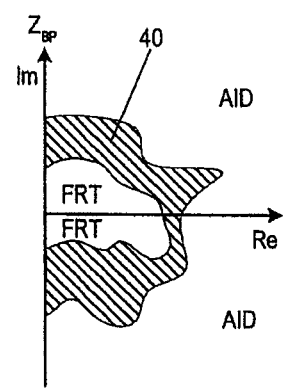

The partial images in FIGS. 3a and 3b depict an exemplary actual structure of a range 40 for the grid impedance Z that can be associated with a normal operating state. The possible values that the grid impedance Z in the example of FIG. 1 can take as one of the output variables 24 in path a or path b are shown in partial images in FIGS. 3a and 3b. The indices "BP" and "BS" indicate the used filter, a bandpass filter as filter 21a in path a (BP) and a band rejection filter (BS) in path b.

Figure 3C:
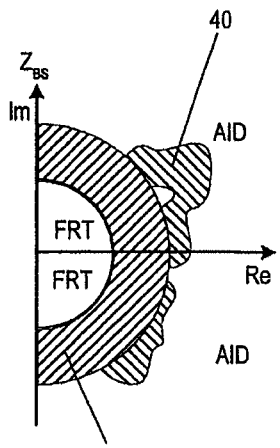
Figure 3D:
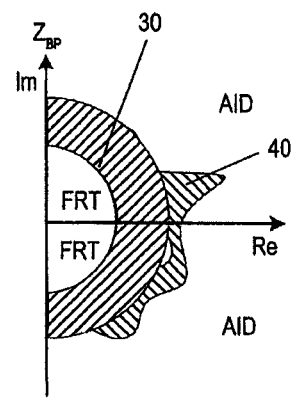

In partial images in FIGS. 3c and 3d, the ranges 40 are shown overlaid with circular ranges 30. It can be seen that the circular ranges 30 indicated in FIGS. 3c and 3d are good approximations of the actual shape of the ranges 40.

The grid impedance Z is a complex-valued variable and is shown in the graphs with its real part on the abscissa of a coordinate system and with its imaginary part on the ordinate. Since negative values of the real part of the impedance are not observed, the possible range of values of the grid impedance Z is limited to positive real parts. Within the valid range of values, it is possible to detect three different ranges. Besides a first range 30, which is associated with the normal operating state and is shown in shaded form in the figures, there exist a second range AID, which is associated with an islanding situation, and a third range FRT, which is associated with a grid fault that needs to be ridden through.

The approximated ranges 30 depicted show examples of how discrimination can be effected by discriminator units 25. Given knowledge of the shape of the actual ranges 40, it is possible to use an appropriately approximated range 30. In this case, however, it should be considered that the power supply grid is a dynamic, changing system in which the transitions between the different grid states can also change.

FIGS. 4a-4d use four partial graphs to illustrate the way of operation of the discriminator unit 25. According to the example of FIG. 1, input variables for the discriminator unit 25 are the output variables 24 from the two paths a, b, the latter being distinguished by the use of a bandpass filter in path a and of a band rejection filter in path b. In each of paths a and b, the output variables 24 provided are the grid impedance Z and the rate of change of the grid impedance dZ/dt, depending on the embodiment also as absolute value |Z| and as rate of change of the absolute value |Z| with respect to time d|Z|/dt.

The first range 30 runs ringlike for the grid impedance Z, which means that it has an associated lower limit value $|Z_{min}|$ and an associated upper limit value $|Z_{max}|$ for the absolute value of the impedance Z. If the absolute value of the impedance is between the two limit values $|Z_{min}|$ and $|Z_{max}|$ (that is to say in the shaded first range 30), the power supply grid is in the normal operating state.

If, by contrast, the absolute value of the impedance Z is above the upper limit value $|Z_{max}|$ of the first range 30, then the impedance Z is in the second range AID, which is associated with an islanding situation. If, by contrast, an absolute value for the impedance Z is observed that is below the lower limit value $|Z_{min}|$ of the first range 30, then the impedance is in the third range FRT, which is associated with a grid fault that needs to be ridden through.

Figure 4A:
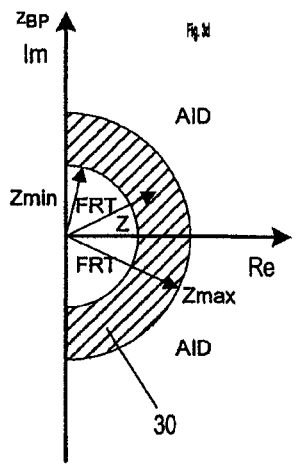
FIGS. 4a-4d show further graphs to illustrate the derivation of operating states of the power supply grid from the determined parameters of the power supply grid.
Figure 4B:
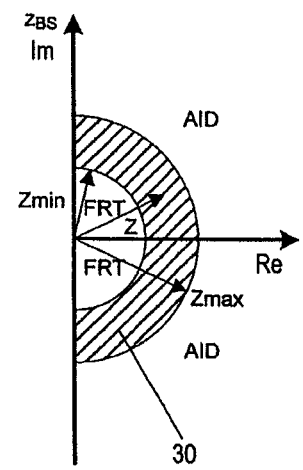

As a comparison of partial images in FIGS. 4a and 4b shows, this distinction can be made both in path a and in path b of FIG. 1, that means in the case of bandpass-filtered input variables and in the case of input variables filtered using the band rejection filter. In this respect, it is generally possible to use each of the two grid impedances $Z_{BP}$ and $Z_{BS}$ determined in different ways to detect the state of the power supply grid. The information obtained in different ways (bandpass/band rejection) have, however, a different weight in terms of their significance.

If in the case of using a bandpass filter (partial image in FIG. 4a) an islanding situation is detected, this reliably rules out the existence of an FRT situation. If, by contrast, an FRT situation is detected in partial image of FIG. 4a, then this has lower significance and cannot reliably rule out the existence of an islanding situation. If a band rejection filter is used (partial image in FIG. 4b), the situation is exactly the opposite: if an islanding situation is detected, this indicates such a situation but cannot reliably rule out the existence of an FRT situation. If, by contrast, an FRT situation is detected, this is explicit and can rule out the existence of an islanding situation.

Figure 4C:
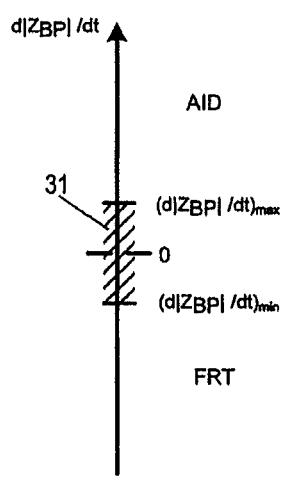
Figure 4D:
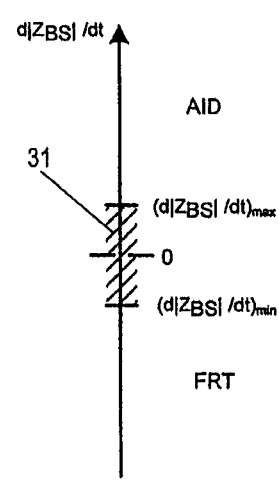

Partial images in FIGS. 4c and 4d, in the same way as partial images in FIGS. 4a and 4b, show what information about the operating state of the power supply grid can be obtained from the determined rates of change of the absolute value of the grid impedance d|Z|/dt. Partial image in FIG. 4c shows the situation for the use of a bandpass filter (path a) and partial image in FIG. 4d shows the situation for the use of a band rejection filter (path b). The rate of change of the absolute value of the grid impedance d|Z|/dt is a real-value variable. Slight, slow changes in the grid impedance Z also arise in the normal operating state, the complex vector at the grid impedance Z remaining within the first range 30 in FIG. 4a and FIG. 4b. In the case of a grid fault, however, there is a rapid, larger change in the grid impedance Z, with the complex vector of the grid impedance Z in FIG. 4a and FIG. 4b moving to the range AID in the case of a positive rate of change and to the range FRT in the case of a negative rate of change.

Hence, on the axis for d|Z|/dt, partial images in FIGS. 4a and 4b denote a first range 31, in which there is a normal operating state of the power supply grid, a second range AID, in which there is an islanding situation, and a third range FRT, in which there is an FRT situation. The first range 31 is distinguished by small values for the rate of change of the grid impedance dZ/dt. At larger values, there is an islanding situation (if the rate of change is positive) or an FRT situation (if the rate of change is negative). The value of a rate of change of zero is always within the first range 31, but not necessarily, as by way of example in FIG. 4c and FIG. 4d, in the center of the range.

Again, the fundamental behavior is comparable for the use of a bandpass filter and a band rejection filter in this case too. As in the case of the grid impedance, however, the results have different significance, depending on whether a bandpass filter or a band rejection filter is used. If a bandpass filter is used (partial image in FIG. 4c), the detection of an islanding situation again reliably rules out an FRT situation. If a band rejection filter is used, the detection of an FRT situation reliably rules out an islanding situation.

FIGS. 5a-5c use three partial images to show three alternative embodiments of the discriminator unit 25. The discriminator unit 25 has respective comparators 250, downstream of which an arrangement of logical units 251 is connected. In the case of the discriminator units 25 shown in FIGS. 5a-5c, the determination of the operating states of the power supply grid 4 is based on circular ranges 30 (cf. FIGS. 4a, 4b). For this reason, in accordance with FIGS. 4a-4b, first of all only the absolute values |Z| of the grid impedance Z and the rate of change thereof d|Z|/dt are used as input information for the discriminator unit 25 for the embodiments of the discriminator unit 25 in FIGS. 5a-5c.

As is evident from the explanations pertaining to FIGS. 4a-4d, every single one of the pieces of information about the grid impedance $Z_{BP}$ or $Z_{BS}$ or about the rates of change of the grid impedance $d|Z_{BP}|/dt$ or $d|Z_{BS}|/dt$ can be used to determine a grid state. On account of the different significance of the results found, however, it is advantageous to use several of the pieces of information together. In the example in FIG. 5a, the grid state is determined by using information about the rate of change of the grid impedance in the two paths a and b. Accordingly, these output variables 24a and 24b are each input to a comparator. This comparator 250 determines which of the three ranges 31, AID, FRT contains the measured rate of change of the grid impedance d|Z|/dt. Outputs of the comparators 250 are set in accordance with the graphs in FIGS. 4c and 4d. If an islanding situation (range AID) is detected, then the output denoted by "high" in FIG. 5a is set to a logic "1" level, while the output denoted by "low" is at a "0" logic level. Conversely, if an FRT situation is detected (FRT range), the "low" output is set to logic "1" and the "high" output is set to logic "0". If a normal operating state is detected (range 31), both outputs "high" and "low" are set to logic "0".

The total of four outputs of the two comparators 250 are combined with each other in a network comprising the logical units 251 such that the output signals 26 from the discriminator unit 25 that are output are again two logic signals that indicate either the existence of an islanding situation or the existence of an FRT situation or, if none of the outputs of the network of logical units 251 is set, the existence of a normal operating state for the power supply grid 4. The interconnection of the output signals from the comparators 250 takes account of the significance of the results of the individual comparators 250 in accordance with the explanations that are provided in connection with FIGS. 4a-4d. Moreover, owing to different input variables 24a, 24b being taken into account, possibly even then a statement about the state of the power supply grid 4 can be provided if a statement would not be possible on the basis of just one of the input variables 24a, 24b, for example because the relevant input variable 24a, 24b is in a range of values in which an appropriate statement cannot be made.

In the alternative embodiment of a discriminator unit 25 as shown in partial image in FIG. 5b, in a comparable manner to in the example in FIG. 5a the grid impedances $Z_{BP}$ and $Z_{BS}$ determined in different ways are processed as input variables 24a and 24b.

In the third embodiment in FIG. 5c, all four output variables 24 (grid impedance and rate of change of the grid impedance) from both paths a and b are taken into account and evaluated appropriately. This way of a maximum level of certainty in the determination of the grid states can be achieved.

It is again pointed out that although the evaluation of the grid impedances or of the rates of change of the grid impedances in accordance with the graphs in FIGS. 4a-4d by the discriminator unit 25 has been explained hitherto on the basis of the grid impedances Z and rates of change of the grid impedances dZ/dt as determined by means of the state observers given by way of example in FIG. 2, in the end, however, it is independent of the type of determination of the grid impedances and the rates of change thereof. The method described for detecting grid faults and for distinguishing between an islanding situation and an FRT situation can accordingly be performed together with any other methods for determining the grid impedances and the rates of change thereof with respect to time.

For the evaluation of the rate of change of the absolute value of the grid impedance d|Z|/dt in accordance with the embodiments in FIGS. 4a-4d and FIGS. 5a-5c, the phase angle of the complex-valued impedance Z is ignored. As a result, it is not possible to distinguish whether the changes in the real and imaginary parts of the impedance Z that underlie the change in the absolute value of the impedance Z have the same or an opposite sign as the change in the absolute value of the impedance Z. Such a statement requires evaluation of the complex-valued rate of change dZ/dt of the complex-valued impedance Z.

In the case of an islanding situation, usually both real and imaginary part of the impedance Z become larger, i.e. the values of the rate of change dZ/dt are within the first quadrant of the coordinate system. In the case of a grid fault that needs to be ridden through, usually both real and imaginary part of the impedance Z become smaller, i.e. the values of the rate of change dZ/dt are within the third quadrant of the coordinate system.

Values of the rate of change dZ/dt in the second and fourth quadrants of the coordinate system can usually be attributed to other grid state changes, for example a startup of a machine in the grid. Since such a grid state change can also arise at the same time as an islanding situation AID or a grid fault FRT that needs to be ridden through, a reliable statement about the state of the power supply grid is not possible on the basis of values of the rate of change dZ/dt in the second and fourth quadrants of the coordinate system. This state in the following is referred to as an undefined impedance change UIC.

In a normal operating state, small, slow changes are possible. Therefore, values of the rate of change dZ/dt are in this case in a range around the origin of the coordinate system.

FIGS. 6a and 7a depict actual structures of ranges 41 that can be associated with the grid states for the rates of change of the grid impedances $dZ_{BS}/dt$ and $dZ_{BP}/dt$ by way of example. In the partial images of FIGS. 6b and 6e, and 7b and 7e, these ranges 41 are compared with differently sized approximated ranges 31 that are rectangular. In the partial images of FIGS. 6c and 6f, and 7c and 7f, these ranges 41 are compared with differently sized approximated ranges 32 that are circular. Finally, the partial images of FIGS. 6d and 6g, and 7d and 7g, show approximated first ranges 33 that have a polygonal outline.

FIGS. 6a-6g and 7a-7g again each contain a first range 41, 31, 32, 33, which is shown in shaded form and which contains the values of the rates of change dZ/dt of the grid impedance Z in the normal operating state. Outside of this range, in the first quadrant of the coordinate system there can be found a second range AID, which comprises the values in the case of an islanding situation, and in the third quadrant there can be found a third range FRT, which comprises the values in the case of a grid fault that needs to be ridden through. Additionally, outside the first range 41, 31, 32, 33, the second and fourth quadrants of the coordinate system there is a fourth range UIC, which comprises the values in the case of an undefined impedance change.

The approximated ranges 31, 32, 33 depicted show examples for how a discrimination can be effected by discriminator units 25. Given knowledge of the shape of the actual ranges 41, an appropriately approximated range 31-33 can be used. In this case, in principle, an arbitrarily precise approximation can be made, but it should be considered that the power supply grid is a dynamic, changing system in which the transitions between the different grid states can also change.

Figure 8:
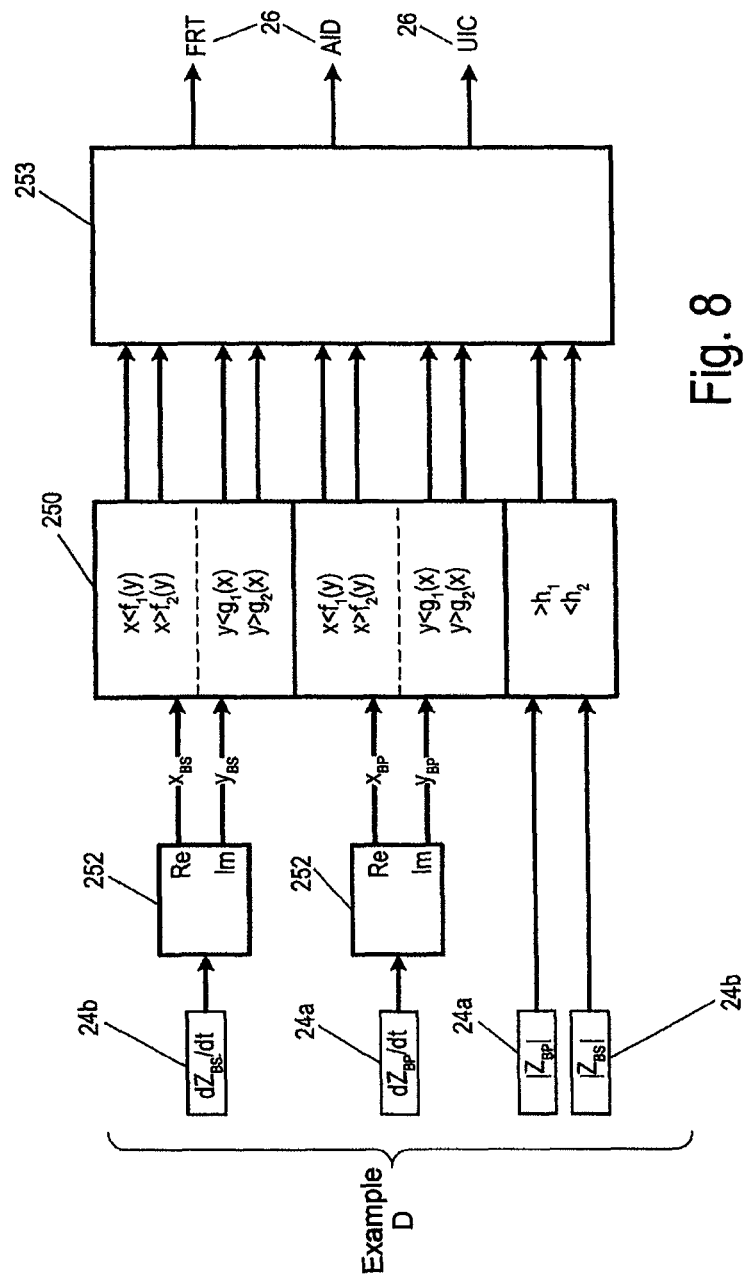
FIG. 8 shows a schematic illustration of a further embodiment of a discriminator unit for deriving the operating states of the power supply grid, and FIGS. 9a-9c each show a schematic illustration of a state observer for determining parameters of a power supply grid in a further embodiment.

FIG. 8 schematically shows, in a similar manner to in the partial images of FIG. 5, a further embodiment of a discriminator unit 25 for determining the grid state. In this embodiment, the output signals 24 are first of all separated into their real and imaginary parts, if the variables involve complex values, in a unit 252. These parts are input separately to a comparator 250, which evaluates them. By way of example, there may be not just fixed threshold values provided for the comparison in this case, but rather threshold values for which the threshold value for the real part is dependent on the imaginary part. By way of example, it is thus possible to scan a polygonal first range 33 (cf. FIGS. 6d, 6g, and FIGS. 7d, 7g). The results from the comparator 250 are combined with each other in a logic unit 253, in order to finally output the present grid state by output signals 26. In the example shown in FIG. 8, a signal "UIC" is used to output not only the signals "FRT" and "AID" but also a further output signal 26. The signal "UIC" becomes active if one of the values of the rates of change dZ/dt of the grid impedance Z is located in the fourth range UIC and at the same time the logic unit 253 has not detected the existence of an islanding situation AID or of a grid fault FRT that needs to be ridden through.

By way of example, the logic unit 253 can operate under program control and/or make use of a truth table (lookup table) or a neural network in order to determine the output signals 26 on the basis of the results from the comparator 250. Alternatively, it may be constructed from an arrangement of logical units 251, in a similar manner to FIG. 5.

Figure 9A:
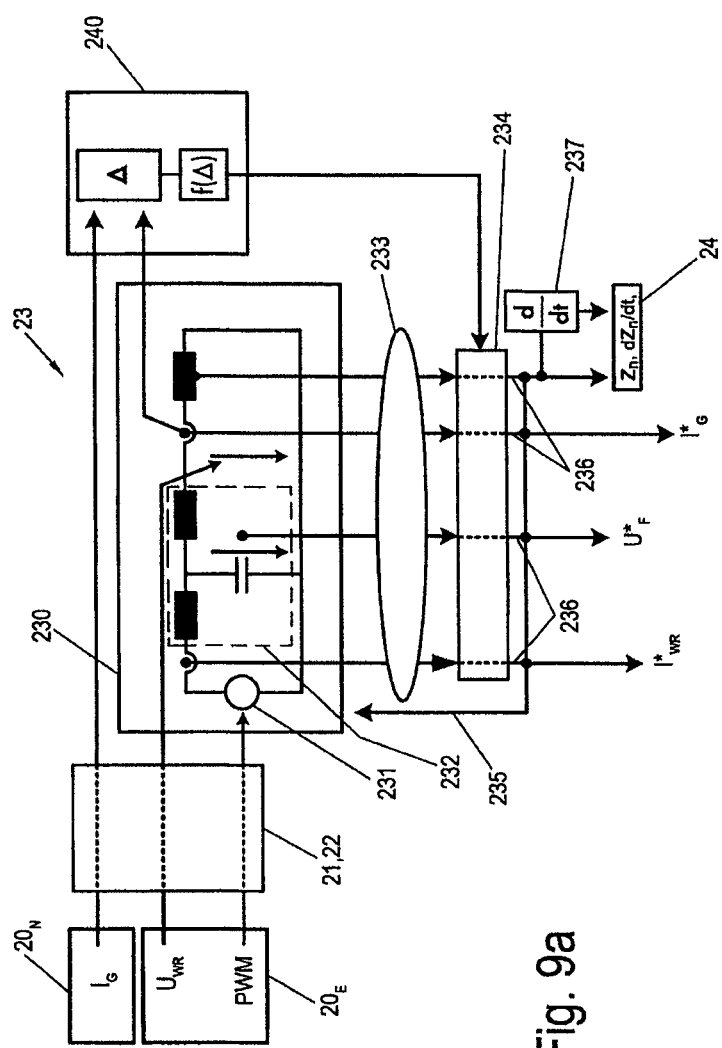
Figure 9B:
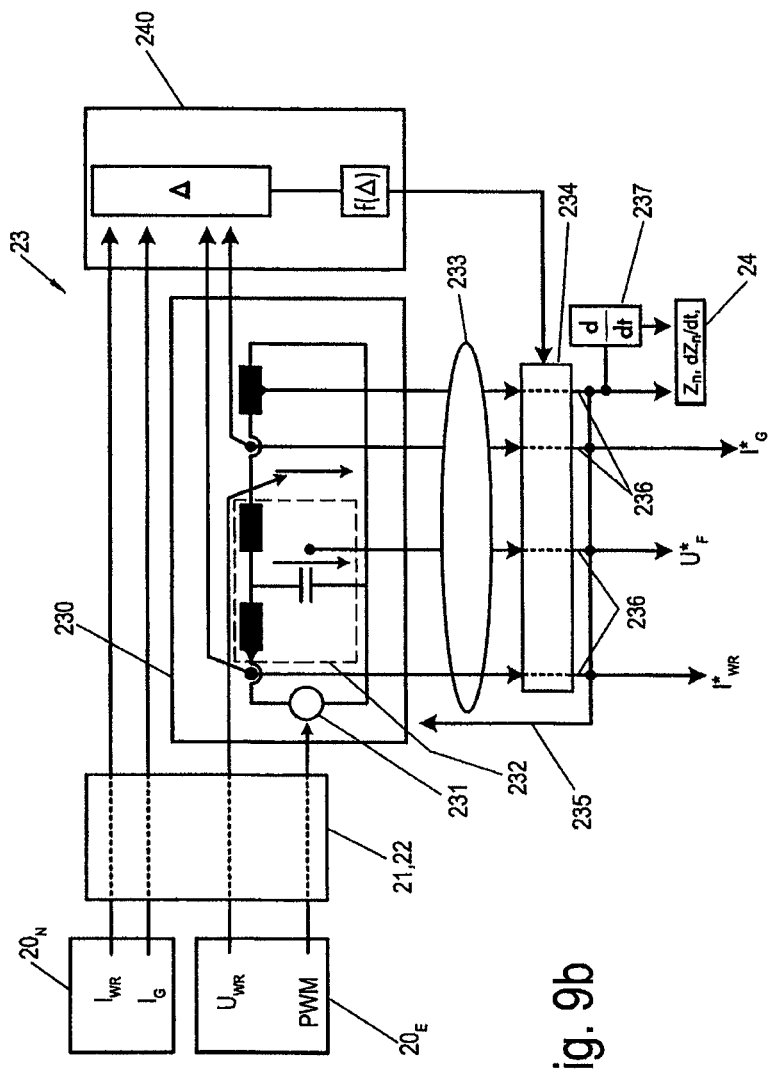
Figure 9C:
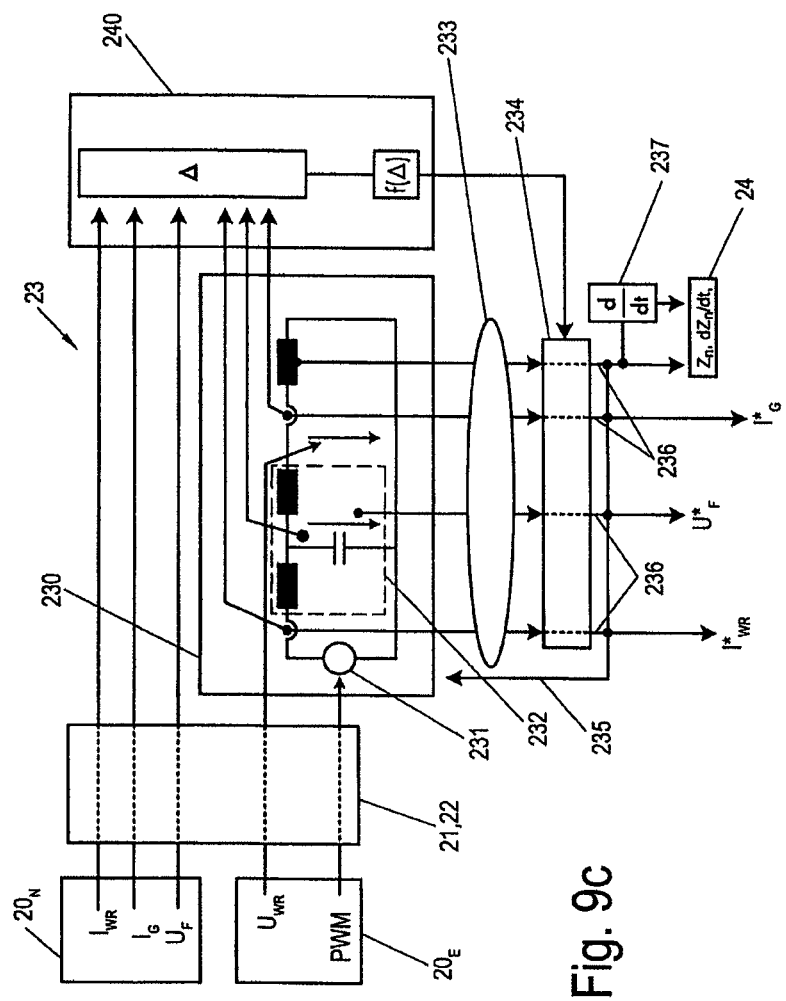

Finally, FIGS. 9a-9c use three partial images in a comparable manner to FIG. 2 to describe three further embodiments of a state observer 23 for determining the grid impedances and the rates of change thereof.

In the embodiment of FIG. 2, the input variables used for the state observer 23 were the voltage signal 13, representing the grid voltage $U_G$ at the grid connection point, and the PWM signal 15. The tracked variable used in the model 230 was the current signal 14 that represents the inverter current $I_{WR}$.

The embodiment of FIG. 9a differs in that, instead of the current signal 14, which, as shown in FIG. 1, represents the inverter current $I_{WR}$, a current signal that represents the grid current $I_G$ is used as a tracked variable.

The embodiments of FIGS. 9b to 9c differ in that, besides the inverter current $I_{WR}$, further variables from the real section are used as tracked variables. FIGS. 9a to 9c show the input variables for the model 230 with the reference symbol $20_E$ and the tracked variables with the reference symbol $20_N$. As shown in FIG. 9b, besides the inverter current $I_{WR}$, the grid current $I_G$ is used as a comparison criterion, and, in the embodiment of FIG. 9c, additionally the filter voltage $U_F$. The provision of further tracked variables can lead to faster and better convergence when adjusting the state variables 233 of the model 230.

It is noted that the input variables and the tracked variables of the model 230 do not necessarily have to be variables measured on the real section, but may also be variables captured in another way. By way of example, the control unit 12 of the inverter 10 or another control device may know particular variables without them being explicitly measured. An example is variables that are set to a predetermined value by the inverter 10. On the assumption that the presetting is implemented correctly, the predetermined value instead of a measured value can be used as an input variable or tracked variable for the model 230.

The invention claimed is:

1. A detection method for an inverter for detecting a grid fault in a power supply grid, comprising:
   determining a grid impedance (Z) and/or a rate of change thereof with respect to time (dZ/dt) and/or a rate of change of an absolute value of a grid impedance (Z) with respect to time (d|Z|/dt);

comparing the absolute value and/or a real part and/or an imaginary part of the grid impedance (Z) and/or the rate of change thereof with respect to time (dZ/dt) and/or the rate of change of the absolute value of the grid impedance (Z) with respect to time (d|Z|/dt) with respective predetermined limit values;

detecting a grid fault state based on a result of the comparison, wherein a distinction is drawn between an islanding situation (AID) and a fault ride through (FRT) situation; and signaling an existing islanding situation (AID) or an existing FRT situation as a grid fault state.

2. The detection method as claimed in claim 1, wherein if an upper limit value ($|Z_{max}|$) for the absolute value of the grid impedance (Z) is exceeded, the existence of an islanding situation is detected and signaled, and wherein if a lower limit value ($|Z_{min}|$) for the absolute value of the grid impedance (Z) is underrun, an FRT situation is detected and signaled.

3. The detection method as claimed in claim 1, wherein an islanding situation or an FRT situation is detected based on the magnitude of the real part and/or the imaginary part of the rate of change of the grid impedance (Z) with respect to time (dZ/dt) and/or based on the magnitude of the value of the rate of change of the absolute value of the grid impedance (Z) with respect to time (d|Z|/dt).

4. The detection method as claimed in claim 3, wherein the islanding situation or the FRT situation is detected if an absolute value of the real part of the rate of change of the grid impedance (Z) with respect to time (dZ/dt) and/or the value of the rate of change of the absolute value of the grid impedance (Z) with respect to time (d|Z|/dt) is greater than a first predetermined limit value and/or an absolute value of the imaginary part of the rate of change of the grid impedance (Z) with respect to time (dZ/dt) and/or the value of the rate of change of the absolute value of the grid impedance (Z) with respect to time (d|Z|/dt) is greater than a second predetermined limit value.

5. The detection method as claimed in claim 1, wherein an islanding situation is detected and signaled if the real part of the rate of change of the grid impedance (Z) with respect to time (dZ/dt) and/or the value of the rate of change of the absolute value of the grid impedance (Z) with respect to time (d|Z|/dt) is positive and an FRT situation is detected and signaled if the real part of the rate of change of the grid impedance (Z) with respect to time (dZ/dt) and/or the value of the rate of change of the absolute value of the grid impedance (Z) with respect to time (d|Z|/dt) is negative.

6. The detection method as claimed in claim 1, wherein determining the grid impedance (Z) and/or the rate of change thereof with respect to time (dZ/dt) and/or the rate of change of the absolute value of the grid impedance (Z) with respect to time (d|Z|/dt) is based on an evaluation of input variables that are filtered in advance by a bandpass filter and/or a band rejection filter.

7. The detection method as claimed in claim 6, wherein the bandpass filter and/or the band rejection filter has a pass or stop frequency for a harmonic pertaining to the grid frequency of the power supply grid.

8. The detection method as claimed in claim 7, wherein the pass or stop frequency of the bandpass filter and/or the band rejection filter is the third harmonic pertaining to the grid frequency of the power supply grid.

9. The detection method as claimed in claim 6, wherein determining the grid impedance (Z) and/or the rate of change thereof with respect to time (dZ/dt) and/or the rate of change of the absolute value of the grid impedance (Z) with respect to time (d|Z|/dt) is based on an evaluation of variables that are filtered in advance in a first evaluation path by a bandpass filter and in a second evaluation path by a band rejection filter.

10. The detection method as claimed in claim 9, wherein the output variables determined in the first and second evaluation paths are combined with different weighting to produce an overall result.

11. The detection method as claimed in claim 1, wherein the grid impedance (Z) and/or the rate of change thereof with respect to time (dZ/dt) and/or the rate of change of the absolute value of the grid impedance (Z) with respect to time (d|Z|/dt) is determined by at least one state observer that emulates and observes a section of an inverter coupled to the power supply grid.

12. An inverter for supplying electric power to a power supply grid, comprising a detection apparatus having a discriminator unit, wherein the discriminator unit is configured to:

compare an absolute value and/or a real part and/or an imaginary part of an afore determined grid impedance (Z) and/or the rate of change thereof with respect to time (dZ/dt) and/or a value of the rate of change of the absolute value of the grid impedance (Z) with respect to time (d|Z|/dt) with predetermined limit values, detect a grid fault state based on a result of the comparison, wherein a distinction is drawn between an islanding situation (AID) and a fault ride through (FRT) situation, and signal an existing islanding situation or an existing FRT situation as a grid fault state.

13. The inverter as claimed in claim 12, wherein an operating state of the inverter is dependent on the signaled grid fault state.

14. The inverter as claimed in claim 12, wherein the detection apparatus comprises at least one state observer configured to determine the grid impedance (Z) and/or the rate of change thereof with respect to time (dZ/dt) and/or the rate of change of the absolute value of the grid impedance (Z) with respect to time (d|Z|/dt), which state observer emulates and observes a section of the inverter.

* * * * *